United States Patent [19]

Hunsperger et al.

[11] 3,901,738

[45] Aug. 26, 1975

[54] ION IMPLANTED JUNCTION LASER AND PROCESS FOR MAKING SAME

[75] Inventors: Robert G. Hunsperger, Malibu; Ogden J. Marsh, Woodland Hills; Michael K. Barnoski, Pacific Palisades, all of Calif.

[73] Assignee: Hughes Aircraft Company, Culver City, Calif.

[22] Filed: May 13, 1974

[21] Appl. No.: 469,137

Related U.S. Application Data

[63] Continuation-in-part of Ser. No. 426,769, Dec. 20, 1974, abandoned.

[52] U.S. Cl. ............ 148/1.5; 250/211; 331/94.5 H; 357/18; 357/83; 357/91

[51] Int. Cl.$^{2}$ ............ H01L 21/265

[58] Field of Search ............ 148/1.5; 250/211; 331/94.5; 357/18, 83, 91

[56] References Cited

UNITED STATES PATENTS

| | | | |
|---|---|---|---|
| 3,245,002 | 4/1966 | Hall | 331/94.5 |
| 3,617,929 | 11/1971 | Strack et al. | 357/18 X |
| 3,691,476 | 9/1972 | Hayashi | 331/94.5 |

OTHER PUBLICATIONS

Harris et al., "Distributed Feedback Semiconductor Injection Laser," IBM Tech. Disc. Bull. Vol. 16, No. 1, 6/73, pp. 171–172.

*Primary Examiner*—L. Dewayne Rutledge
*Assistant Examiner*—J. M. Davis
*Attorney, Agent, or Firm*—W. H. MacAllister; Donald C. Keaveney

[57] ABSTRACT

There is disclosed a process of ion implantation doping of a semiconductor followed by application of a surface passivating layer and annealing to produce therein shallow junctions the actual depth of which can be accurately controlled either as a function of the conditions of the annealing which causes diffusion of the implanted ions primarily into the semiconductor to form a junction at a depth which is proportional to the square root of the time of annealing for a given temperature where an ion such as Zn is used which will diffuse, or as a function of the energies and doses of a plurality of implantation steps where an ion such as Be which will not diffuse during annealing, is used. The first process was, for example, used as a doping technique to fabricate an injection laser in GaAs by using the Zn atom as a dopant resulting in a junction at a depth of one micron from the surface. At 77°K the threshold current density of the junction required to produce lasing was 140 amps/cm$^2$. The second process was, for example, used to fabricate an injection laser in GaAs with its junction at 1.6 microns below the surface using four different sequential implantation steps. Such a laser can be formed as a discrete component or it can be formed integrally with a waveguide and a utilization circuit. There is shown, by way of example, the combination of a laser, a waveguide and a photodetector formed integrally in a chip to produce an opto-isolator.

16 Claims, 20 Drawing Figures

(Before Lasing)

(After Lasing)

ION IMPLANTED JUNCTION LASER AND PROCESS FOR MAKING SAME

RELATED APPLICATION

This application is a continuation-in-part of our pending application Ser. No. 426,769 filed Dec. 20, 1974, entitled "Ion Implanted Junction Laser and Process for Making Same", now abandoned, which is assigned to Hughes Aircraft Company as is this application.

FIELD OF THE INVENTION

This invention relates generally to semiconductor devices and to processes of fabrication thereof. More particularly it relates to a method for reliably and controllably forming a uniform planar P-N junction at a predetermined shallow depth below the surface of a semiconductor body either by implantation of dopant ions into the surface of said body followed by controlled annealing of said implanted semiconductor to form said junction or by implantation of ions in a sequence of steps at different energies and doses. The junctions so formed have characteristics which render them suitable for use in lasers which may be either of the discrete component type using Fabry-Perot reflecting surfaces and electrical pumping or which may be formed as a portion of a monolithic integrated optical circuit in which the laser output is transmitted through a waveguide portion integral therewith to a utilization circuit and wherein the laser uses surface gratings to produce distributed light feedback to result in lasing action in response to electrical pumping.

RELATED APPLICATIONS AND PUBLICATIONS

Certain related fabrication procedures which may be used in conjunction with the method of junction formation disclosed herein in order to produce the completed products disclosed herein have been disclosed and claimed in copending applications assigned to the present assignee. One such application was filed on June 29, 1973, on behalf of Gordon A. Shifrin and Robert G. Hunsperger as Ser. No. 375,227 entitled "Monolithic Planar Opto-Isolators and Processes for Fabricating Same." That application discloses an opto-isolator wherein a non-lasing radiation emitting P-N junction, a radiation waveguide coupling region, and a radiation sensitive detector are monolithically formed in a semiconductor substrate. The opto-isolator disclosed and claimed herein is an improvement over the device described therein. In particular, the light emitting junction of the earlier case is herein replaced by an injection laser formed in accordance with the process of the present invention to achieve increased electrooptical conversion efficiency.

Another such application was filed on Aug. 23, 1973, as Ser. No. 390,836 on behalf of Robert G. Hunsperger, Harold M. Stoll, Gregory L. Tangonan and Amnon Yariv entitled "Integrated Optical Detector." That application relates to an integrated optical circuit comprising a waveguide and an optical detector integrally formed in a semiconductor body by a process of proton irradiation of selected portions thereof. The waveguide and detector as described in that application are an improvement over the earlier application and are preferably used in the opto-isolator of the present application rather than the detector described in Ser. No. 374,227.

Another such copending application was filed on Feb 28, 1973, as Ser. No. 336,679 on behalf of Hugh L. Garvin, Amnon Yariv, and Sasson Somekh entitled "Process for Fabricating Small Geometry Semiconductive Devices Including Integrated Optical Components." The process disclosed therein may be used to form the feedback producing gratings in the laser of the present invention.

A publication by two of the inventors herein, R. G. Hunsperger and O. J. Marsh entitled "Conversion of GaAs to $Ga_{1-x}Al_x$" as appeared in the *Bulletin of the American Physics Society*, Series II, Vol. 14, No. 3, Mar 1, 1969, page 373. The process disclosed therein may be used as an alternative to proton irradiation or to conventional expitaxial growth techniques to be discussed below in the formation of the waveguide of the present device and comprises a method for converting gallium arsenide to gallium aluminum arsenide by implanting a dose of aluminum ions into a substrate of gallium arsenide and subsequently annealing the substrate at specified temperatures. The energy band gap of compound semiconductor crystals is a function of the relative concentrations of the constituent elements. The relative concentrations of gallium and aluminum are controlled in accordance with the teachings therein in order to tailor the optical characteristics of the resulting gallium aluminum arsenide crystal to desired specified values. Although the process of that abstract does not disclose and is not suitable for junction formation of the type disclosed herein, it may in some devices be used to control the optical waveguide characteristics of certain portions of the gallium arsenide substrate in which the devices of the present invention are preferably formed.

PRIOR ART

Although ion implanted semiconductor diode junctions of poor quality of optical emission have in the past been known, semiconductor junction lasers have heretofore been formed as discrete components by diffusing an acceptor such as zinc in one side of a Te (donor)-doped galium aresenide crystal. Such a laser is, for example, shown in FIG. 56 and described at page 143 of a book entitled "Introduction To Laser Physics" written by Bela A. Lengyel and published in 1966 by John Wiley & Sons Inc. of New York. Lasers formed in accordance with the present invention operate in a manner similar to that of existing diffused diode lasers except that the ion implanted junction laser of the present invention has a junction which is more uniform than a diffused junction and which can be made to lie much closer to the surface of the laser crystal than is possible for a diffused junction. This shallow junction depth is essential in optical integrated circuits and other thin film devices. Also, the very planar, uniform junction region created by the ion implantation method of this invention tends to increase the width of the lasing region over that of the usual narrow "lasing filaments" of perhaps 50 microns observed in diffused diode lasers. The effect of such an increased width is higher conversion efficiency, lower threshold current and narrower beam divergence angle in the plane of the junction. These characteristics are essential where the laser is to be formed not as a discrete component but as an element of a monolithic integrated optical circuit and are desirable even in discrete components.

The general field of integrated optics has been discussed in many of the above identified copending applications and the references referred to therein. It was also discussed in a published article entitled "Integrated Optics-An Introduction" by S. E. Miller in the "Bell System Technical Journal" in September, 1969, Vol. 48, pages 2059–2069. The term is generally applied to semiconductor integrated circuits wherein the signal is at optical frequencies. The terms "optical frequencies" or "light" are, of course, used to include the infrared, the visible, and the ultraviolet regions of the electromagnetic spectrum.

Prior art patent literature pertaining to this field has generally relied for a light source upon coupling an externally generated laser beam into a thin film optical waveguide or upon the use of integrated electroluminescent diodes. Typical of such prior art are the following patents:

A) U.S. Pat. No. 3,610,727 Reinhard Ulrich, Oct. 4, 1971 "Coupling Arrangement For Thin Film Optical Devices".

B) U.S. Pat. No. 3,465,159 F. Stern, Sept. 2, 1969, "Light Amplifying Device".

C) U.S. Pat. No. 3,619,796 Harold Seidel, "Phase Matching Arrangement In Parametric Traveling Devices".

D) U.S. Pat. No. 3,660,673 Dean B. Anderson, May 2, 1972, "Optical Parametric Device".

E) U.S. Pat. No. 3,674,335 A. Ashkin, July 4, 1972, "Light Wave Coupling Into Thin Film Light Guides".

F) U.S. Pat. No. 3,617,109 Ping K. Tien, Nov. 2, 1971, "Light Guide Coupling & Scanning Arrangement".

One patent which does disclose a laser in a semiconductor substrate is the following:

G) U.S. Pat. No. 3,631,360 Kurt Lehovec, Dec. 28, 1971, "Electro-Optical Structures Utilizing Fresnel Optical Systems".

FIG. 7 of Lehovec discloses the details of a laser combined with a Fresnel lens system wherein the laser relies upon optical rather than electrical pumping to generate a light beam which is directed as an output from the semiconductor chip rather than transmitted through it. In discussing his structure of FIG. 11 at lines 7 through 53 of col. 8, Lehovec describes a laser 402 which is intended to be optically pumped by light supplied through waveguide 401 having semireflective parallel front and back surfaces 404 to promote laser modes. He then notes that by virtue of the bidirectional nature of light propagation, the dielectric waveguide 401 can also be considered as a means to couple laser radiation "to the outside" and that the laser may then be pumped electrically. No such electrically pumped junction laser is disclosed in detail, but at lines 39 through 48 he further states that the methods required for preparation of the structure are conventional. This would imply that any junction intended to be formed would have been formed by diffusion methods which are unsatisfactory for the applications intended in the devices described herein.

Other prior art devices which show monolithic coupling devices, solid state transformers and the like do not disclose the means for using a laser in such devices. Typical of this type of art are the following references:

H. U.S. Pat. No. 3,445,686 R. F. Rutz, May 20, 1969, "Solid State Transformer".

I. U.S. Pat. No. 3,748,480, Michael G. Coleman, July 24, 1973, "Monolithic Coupling Device Including Light Emitter and Light Sensor".

Papers representative of the present state of the art in relation to Be doped GaAs are as follows:

J. "Coherent Radiation of GaAs p-n Junctions Prepared by the Diffusion of Beryllium" by E. A. Poltoratshii et al., *Soviet Physics-Solid State*, Vol. No. 7, January 1966, describes Be doped lasers produced by diffusion rather than by implantation.

K. "The Effect of Be + Ion Implanted Exponential and Uniform Impurity Profiles on the Electrical Characteristics of GaAs Solar Cells" by K. V.. Vaidyanathan et al., presented at the 10th IEEE Photovoltaic Specialists Conference at Palo Alto, Calif., on Nov. 13–15, 1973, describes multiple energy Be implantation to produce a junction for a solar cell, but not for a laser.

BACKGROUND OF THE INVENTION

Gallium arsenide (GaAs) and gallium-aluminum-arsenide (GaAlAs) are particularly interesting materials from the point of view of the processing which makes it possible to achieve with them electrical and optical properties and layer dimensions optimized for application to optical waveguides and integrated optical devices. The energy gap and the index of refraction of GaAlAs depend on the Al concentration and, therefore, one can control the mode properties of guiding films by varying the composition of the film and the substrate in addition to be being able to control the range of transparency of the material. This leads to great flexibility in kinds of devices and integrated circuits which can be realized with GaAs as the basic material. For example, a GaAs injection laser can be used in conjunction with GaAlAs waveguides or modulators which have sufficient Al concentration to allow low loss propagation of the laser emission. GaAs can also be used to fabricate integrated detectors since its absorption edge can be conveniently and appreciably decreased in energy by such techniques as proton implantation. Because of the high electro-optic and acousto-optic coefficients GaAs and GaAlAs can be effectively used for modulators and deflectors at various wavelengths compatible with the available light sources. The high non-linear coefficient and the possibility of phase matching in guiding structures (including periodic structures) makes GaAs attractive for thin film nonlinear devices. It is thus seen that a laser which is monolithic with an integrated optical circuit formed in the GaAs-GaAlAs system has a large variety of possible applications which make possible a high level of integration.

From the point of view of material preparation and fabrication, GaAs and GaAlAs are also attractive. The GaAlAs system has the advantage that the lattice constant is almost independent of the Al concentration so that transitions in compositions can occur without the introduction of defects to accommodate a lattice constant change. The state-of-the-art of epitaxial growth techniques for GaAs and GaAlAs is also sufficiently advanced to readily afford fabrication and growth techniques suitable to meet the requirements of integrated optical devices. There remains in the state-of-the-art a need for a method of fabrication of an electrically pumped laser which is integral with a monolithic circuit and the output from which can be conducted to other integrated optic devices in the chip in response to the supply of an electrical pumping input only. Such a fabrication method and device is provided by the present invention.

SUMMARY OF THE INVENTION

In accordance with one aspect of the present invention a semiconductor diode laser is fabricated by implantation of the zinc ion in the surface of a gallium arsenide wafer which is thereafter coated with a passivating layer of silicon dioxide to prevent disassociation of the gallium arsenide and to prevent out-diffusion of the zinc atoms during the subsequent annealing step which electrically activates the implanted zinc atoms and removes implantation caused lattice damage and the duration of which controls the depth of the junction with respect to the surface of the gallium arsenide. After annealing the oxide layer is removed from the wafer. If a discrete component laser is to be formed the wafer is then diced by sawing and cleaving to form a rectangular laser crystal the opposite parallel sides of which are polished to provide Fabry-Perot reflecting surfaces. Electrical contacts are then applied to the surfaces parallel to the junction layer for electrical pumping. For fabrication of a laser in an integrated optical circuit formed entirely in a wafer, a waveguide is first formed adjacent to the area which is to become the laser and thereafter the implantation and annealing steps discussed above are applied to the laser area. No reflecting surfaces can be formed inside the wafer, but reflections are generated by forming diffraction gratings on the surface of the wafer above the interface between the laser area and waveguide and above the opposite edge of the laser area. These gratings can be merged to a single grating extending over the entire length of the laser if greater feedback is desired. Contact areas are then applied to the base of the substrate and to the area between the diffraction gratings (or over the single grating if used) and above the junction so that electrical pumping energy may be supplied to the laser. A utilization circuit or device such as a photodetector may then be formed at the other end of the waveguide.

An equivalent laser device may also be formed by replacing the single step zinc implantation plus annealing steps by an alternative process of multiple beryllium implant in GaAs at four different energies and doses to form a uniform concentration p-type region or layer at a depth of between one and two microns below the surface, the depth here being controlled by the energies and doses chosen rather than by subsequent annealing since beryllium ions do not diffuse substantially during the anneal cycle.

BRIEF DESCRIPTION OF THE DRAWINGS

These and other features and advantages of the invention will be more readily understood from the detailed description below taken in connection with the accompanying drawings wherein like reference characters refer to like parts throughout and in which.

DETAILED DESCRIPTION

Figure 1A:
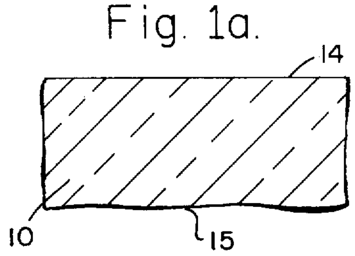
FIGS. 1*a*, 1*b*, 1*c* and 1*d* are schematic views illustrating the sequential steps in the fabrication of a discrete component form of laser in accordance with the present invention.
Figure 1B:
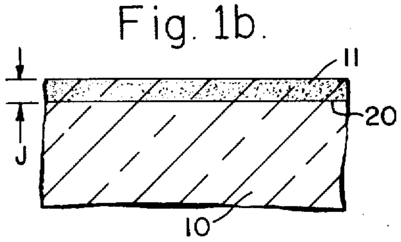
Figure 1C:
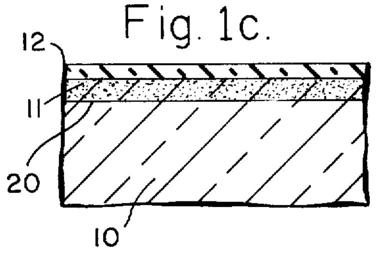
Figure 1D:
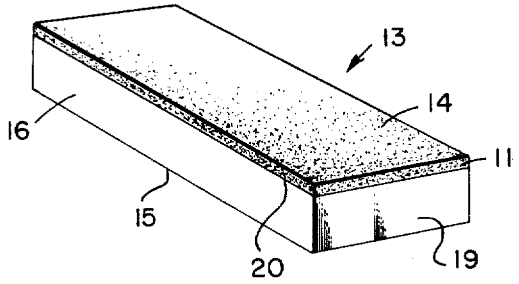
Figure 1E:
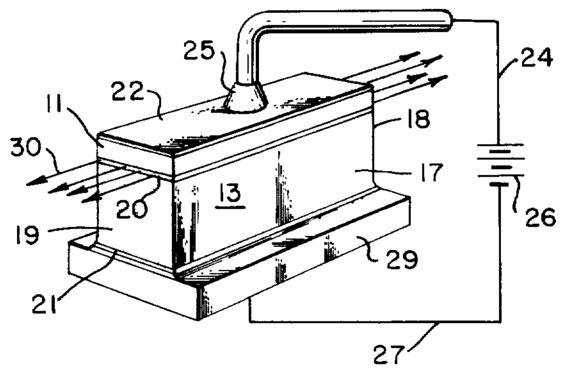
FIG. 1*e* is a perspective view showing the mounting and connection of the laser of FIG. 1*d*.

The semiconductor diode junction laser shown in FIG. 1*e* and in FIGS. 1*a*, 1*b*, 1*c* and 1*d* in various stages of fabrication by the ion implantation process disclosed herein has a junction which is more uniform than that of a diffused junction laser and which can be made to lie much closer to the surface of the laser crystal. These differences give even the discrete component form of the implanted junction laser several advantages over the diffused junction laser.

First, the very shallow junction produced by ion implantation makes it possible to have the cooling surface of a cryogenic refrigerator very close to the junction of the laser crystal. Hence, for a given cooling surface temperature, the junction temperature is lower for an ion implanted diode than for a conventional diffused diode. A lower junction operating temperature results in higher conversion efficiency (light output per unit electrical input) and better frequency stability. The output wavelength of a pulsed diode laser is known to drift during the pulse length due to heating of the junction region. This effect is reduced in the ion implanted laser. Secondly, experiments have shown that ion implanted junction diodes have a very planar, uniform junction region. Such a uniform junction increases the lasing region over that of the usual narrow "lasing filaments" observed in diffused diode lasers which filaments may be about 50 microns wide. The effect of such an increase in width is also to provide higher conversion efficiency and narrower divergence angle in the plane of the junction. Finally, the shallow junction depth in the ion-implanted laser is suitable for use in optical integrated circuits where one desires to couple light efficiently from a laser to an integral waveguide which may be a few microns in thickness. In the integrated circuit application it still retains all of the advantages discussed above for the discrete component embodiment shown in FIGS. 1*a*, 1*b*, 1*c*, 1*d* and 1*e*.

The fabrication of an ion implanted junction semiconductor laser was accomplished as shown in FIGS. 1*a*, 1*b*, 1*c* and 1*d* by way of example, according to the following first process embodiment.

First, a tellurium doped ($1\times10^{18}/cm^3$) <100> n-type GaAs wafer 10 was thinned to a thickness, *t*, of approximately 0.003 inches and polished by using conventional lapping and etch polishing techniques. This may be the first step, but preferably it can be performed after the annealing described below for ease of handling.

Second, the wafer 10 was placed in an ion implantation vacuum chamber and was implanted at room temperature with a dose of $1\times10^{16}/cm^2$, 30KeV $Zn^+$ ions. The implanted layer 11 thus formed had a depth of about 0.1 micron as seen in FIG. 1*b*.

Third, the wafer was removed from the implantation chamber and was coated with a layer 12 of $SiO_2$ by use of conventional "Silox" deposition methods. As seen in FIG. 1*c*, the purpose of this $SiO_2$ layer is to prevent dis-association of the GaAs and out diffusion of the Zn atoms during the subsequent annealing.

Fourth, after the $SiO_2$ layer 12 was deposited on the implanted wafer it was placed in an annealing furnace and annealed for 3 hours at 900°C. This anneal is necessary to electrically activate the Zn atoms and to remove implantation-caused lattice damage and the associated non-radiative recombination centers. While annealing at 800°C is sufficient to produce essentially full restoration of electrical properties annealing at 900°C is required to reduce the concentration of non-radiative centers to the point where efficient lasing and optical emission from said junction can occur.

Fifth, after annealing the oxide layer 12 was removed from the wafer by etching in hydrofluoric acid and the wafer was diced by sawing and cleaving to form a rectangular laser crystal 13 as shown in FIG. 1*d*.

The resulting crystal 13 has a top surface 14 and a bottom surface 15 which are portions of the original polished top and bottom surfaces of the wafer 10 from which the crystal was cut. Crystal 13 also has the sawed side surfaces 16 and 17 and the cleaved end surfaces 18 and 19. The juncion 20 has been formed at a depth J beneath the top surface 14 as a result of diffusion of the implanted ions during the annealing time. The cleaved end surfaces 18 and 19 form semireflective Fabry-Perot surfaces to facilitate lasing action. When connected in operation the laser emits light in the plane of the junction 20 from the end surfaces 18 and 19. In one typical example the laser crystal had a thickness, *t*, of about 75 microns, a length, l, of about 500 microns, and a width, *w*, of about 250 microns.

Sixth, in order to supply input electrical current to the laser, low resistance ohmic contacts 21 and 22 as shown in FIG. 1*e*, must be made to the two polished surfaces 15 and 14 shown in FIG. 1*d*. The contact 21 to the surface 15 furthest from the P-N junction 20 can be made by using any of the standard alloying techniques presently used in the industry. The contact 22 to the surface 14 nearest to the junction 20 should be a very shallow "micro-alloyed" layer to avoid short circuiting the thin junction region. This contact was in one example made by evaporating a layer of Au:Ge (88% Au, 12% Ge) covered with a layer of nickel and heat treated at 400°C for 5 minutes. In operation, this contact should be held in good thermal contact with the cooling surface of a cryostat schematically shown at 25. Laser action is obtained by passing sufficient electrical current through the device as is done in a conventional diffused laser. This current may be derived from a power source 26 having one terminal connected by conductor 27 through a base member 29 to crystal contact surface 21 and having the other terminal connected by conductor 28 to the contact layer 22 on upper surface 14 of the crystal 13. The laser converts this electrical energy into light energy 30 which is emitted in the direction perpendicular to the cleaved Fabry-Perot surfaces 18 and 19.

Figure 2:
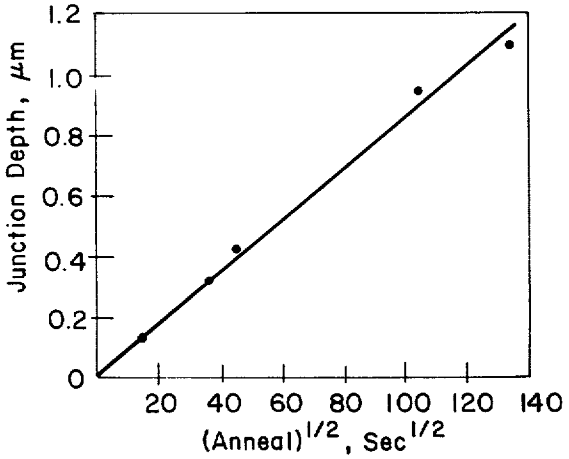

A plot of the junction depth, J, for a crystal such as 13 formed in accordance with the above process as a function of anneal time is shown in FIG. 2. The junction depths were determined by using angle section and staining techniques. In FIG. 2 the square root of the anneal time is plotted as abscissa whereas the junction depth in microns is plotted as ordinate. After a 3 hour anneal time the junction is 1 micron deep. The linear relationship shown in the graph of FIG. 2 shows an experimentally determined dependence of the junction depth on the square root of the anneal time and thus indicates that the depth is established by diffusion ofthe zinc atoms from the implanted layer during annealing. Junction depth can thus be accurately controlled by changing the anneal time for a given substance and temperature. The data of FIG. 2 were taken for zinc implanted gallium-arsenide annealed at 900°C. Such diffusion from an implanted and $SiO_2$ encapsulated "source" layer avoids the problem of dissociation of the gallium-arsenide which prevents the formation of shallow junctions by diffusion from a vapor source.

Figure 3A:
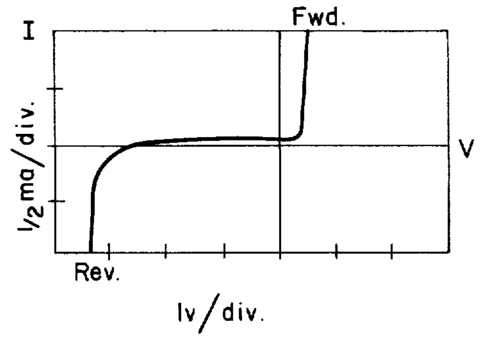
Figure 3B:
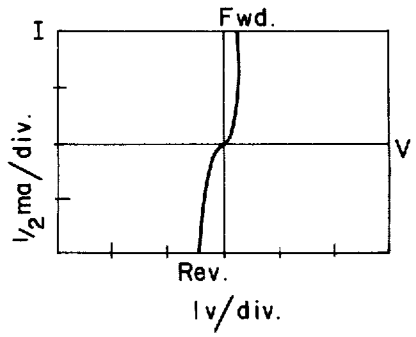
Figure 4:
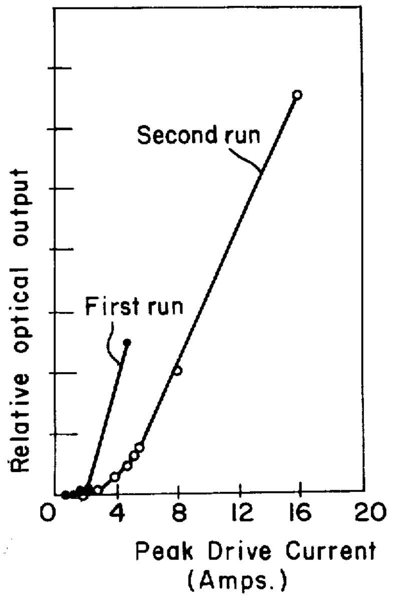

When such a typical device was cooled to 77°K, placed in the circuit of FIG. 1*e*, and pulsed with 100 ns pulses at a repetition rate of 200 Hz, laser action was observed. The relative optical output as a function of drive current is shown in FIG. 4 for several data runs. Although, as can be seen the device is degrading with use, this degradation also occurs in conventional p-n junction lasers and can be eliminated by using superior quality GaAs in terms of low numbers of dislocations and contaminant atoms. This degradation also manifests itself in the I–V characteristics shown in FIGS. 3*a* and 3*b* which were derived from oscilloscope photographs. FIG. 3*a* shows the characteristics before lasing whereas FIG. 3*b* shows the same characteristics after lasing. As can be seen by comparing FIG. 3*b* with FIG. 3*a*, the reverse leakage current increased dramatically after lasing. Thereafter the degradation tends to stabilize.

Figure 5:
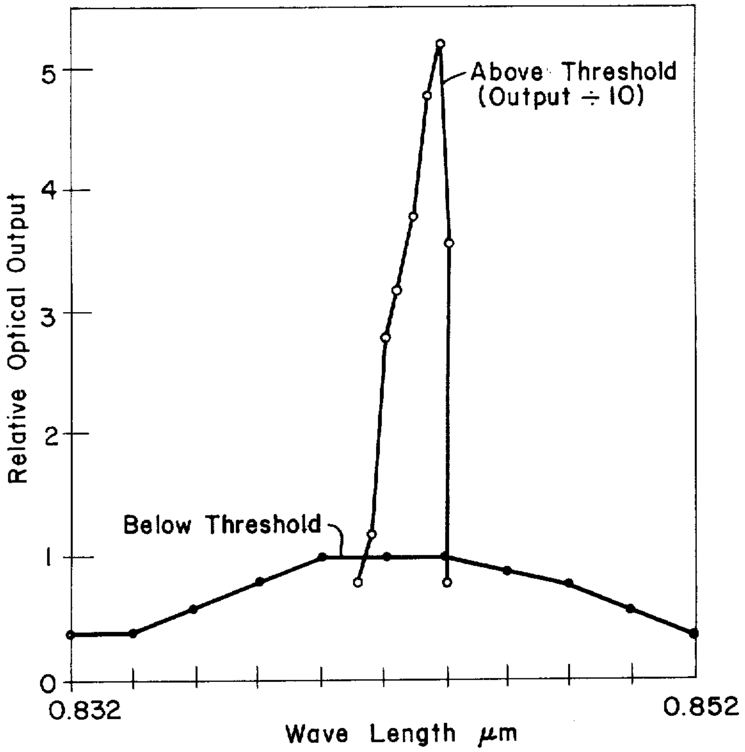
FIGS. 2, 3*a*, 3*b*, 4 and 5 are graphs showing various characteristics of the laser of FIG. 1*e*.

The spectral characteristics both below and above threshold are shown in FIG. 5. Below threshold the half width is approximately 200 angstrom units. When the device is pumped above threshold the optical output increases drastically and the line width narrows. The data shown in FIG. 5 are monochrometer resolution limited. There is further evidence that the actual width is less than one angstrom unit.

For the above discussed pulses having a width of 100 nanoseconds and a repetition rate of 200 H, the threshold current density for lasing was measured to be as low as 140 amps per $cm^2$ in order to produce the above threshold output as shown in FIG. 5. This is lower than what would be expected for a comparable diffused junction laser. The ion implanted junction laser is thus seen to be particularly useful in applications where adequate heat dissipation is a problem and hence high conversion efficiency is needed. Because higher efficiency implies lower threshold current density required for lasing to occur, this type of laser is useful in applications where current or power drain is to be minimized. Higher efficiencies can also facilitate continuous wave operation and/or higher temperature operation.

In addition to fabricating laser diodes in gallium arsenide by zinc implantation as discussed above and as illustrated in FIGS. 1*a* through 1*d* of the drawings, lasing p-n junctions have also been formed by implantation of beryllium ions in gallium arsenide. Unlike zinc, the beryllium ions do not diffuse substantially during the anneal cycle. However, by virtue of their light weight they can be implanted to the desired depth at reasonable voltages. On the other hand, zinc has an anomalously high diffusion rate in GaAs which Be does not have. As a result, in order to form a p-type layer between one or two microns deep, a depth which is very compatible with single mode waveguides in gallium aluminum arsenide, multiple beryllium implants at four different energies and doses were required to form a uniform concentration p-type region. Subsequent annealing to eliminate nonradiative recombination centers and to cause the Be to move to substitutional sites in the lattice will not result in significant diffusion and hence will not affect the junction depth established by implantation.

In one example of this second embodiment of the process of this invention, the following doses and energies were used with a tellurium doped n-type gallium arsenide wafer thinned as described in the first step of the above described zinc implantation process embodiment and placed in an ion implantation vacuum chamber for the multiple sequential implantations.

The exemplary four implantations of beryllium ions into the gallium arsenide wafer were as follows:

First: $1\times10^{16}Be^+/cm^2$ at 300KeV
Second: $7.4\times10^{15}Be^+/cm^2$ at 160KeV
Third: $4.4\times10^{15}Be^+/cm^2$ at 70 KeV
Fourth: $1.85\times10^{15}Be^+/cm^2$ at 20 KeV The sample was then removed from the vacuum chamber and coated with silicon dioxide by chemical vapor deposition to prevent disassociation during annealing. It was then annealed at 900°C for three hours to electrically activate the implanted beryllium ions. Laser crystals were then cleaved and supplied with contacts as described in the first embodiment of the process set forth above.

When cooled to 77°K in a cryostat and forward biased with 100 nanosecond pulses of current at a density of approximately 1,000 amps per square centimeter, the device was observed to lase. The junction depth was measured to be 1.6 microns, which is very compatible with waveguides in integrated optical circuits.

The shallow junctions of these ion implanted lasers (at the order of one micron) as formed by either process is particularly useful in optical integrated circuit applications. In that case, cleaved end faces are not used as the reflectors of the optical resonant structure since they are physically inconsistent with integration. Instead, a distributed feedback laser structure is fabricated with the required reflections being provided by surface gratings.

Figure 6:
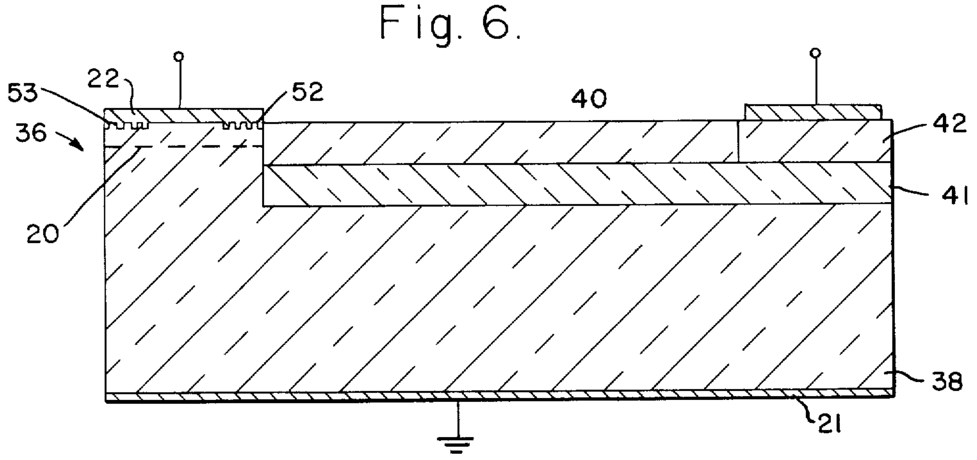
FIGS. 6 and 7 are respectively sectional views of first and second embodiments of opto-isolators including an ion-implanted junction laser.
Figure 7:
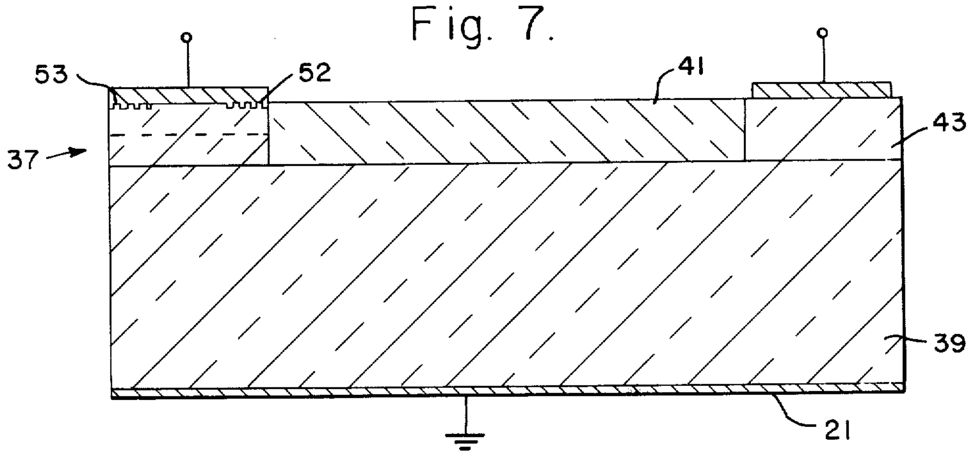

A first type of such an integrated circuit opto-isolator is shown in FIG. 6, whereas a second type of such a device is shown in FIG. 7. FIGS. 8 through 15 are illustrative of the fabrication steps involved in making the devices of FIGS. 6 and 7.

In FIG. 6 there is shown a broken away perspective view of a portion of a semiconductor wafer which includes an ion implanted junction laser 36 formed integrally on a substrate 38 with a waveguide 40 and a proton implanted detector volume 42. The corresponding areas in the similarly taken view of FIG. 7 are the ion implanted junction laser 37 formed on a substrate 39 which also includes a waveguide 41 and a proton implanted detector volume 43 all of which form an integral or monolithic structure. The specific characteristics of the two structures are slightly different due to the difference in fabrication techniques which will be apparent from the discussion of FIGS. 8 through 15.

Figure 8:
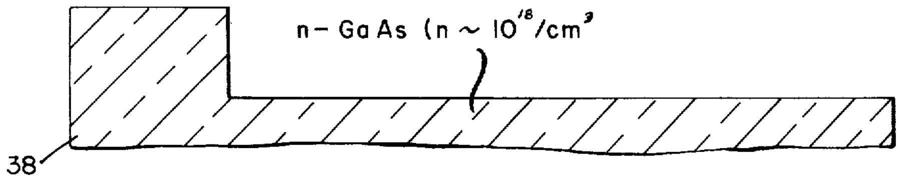
FIGS. 8, 9, 10, 11, 12 and 13 are diagramatic sectional views illustrating the steps used in the process of fabricating the device of FIG. 6.

The fabrication of the device of FIG. 6 is illustrated in FIGS. 8 through 13. In FIG. 8 it is seen that one starts with a substrate 38 of n-tyupe ($n=10^{18}/cm^3$) gallium-arsenide and etches away the upper right hand corner region of what was originally a wafer of rectangular cross section. The etched away region is the area where the waveguide and photodetector shown in FIG. 6 are desired to be located. This area is etched away to a depth of about 6 microns using standard etching techniques.

Figure 9:
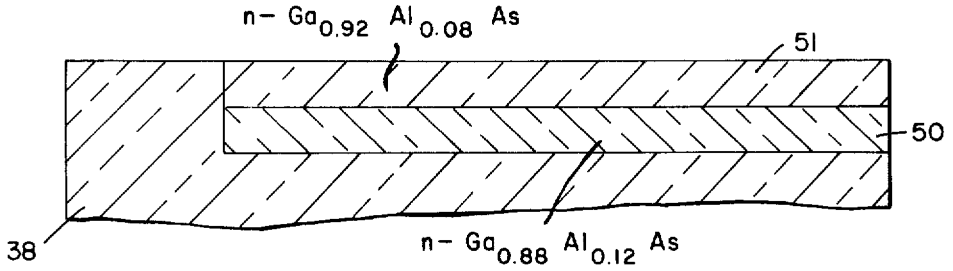

In FIG. 9 it is seen that the next step is to place the etched away substrate 38 in an epitaxial growth reactor to grow first and second layers 50 and 51 of $Ga_xAl_{(1-x)}As$ as layers to form the waveguide region 40 of FIG. 6. Standard techniques of epitaxial growth are used including the step of masking those regions of the substrate where no gallium aluminum arsenide layer is desired to be grown. Each of the layers 50 and 51 has a depth of about 3 microns. The layer 51 which when completed forms waveguide 40, should have an energy band gap wide enough so that light of 0.9 microns wavelength, which will be emitted from the gallium-arsenide laser 36, will not be strongly absorbed in the waveguide.

Figure 10:
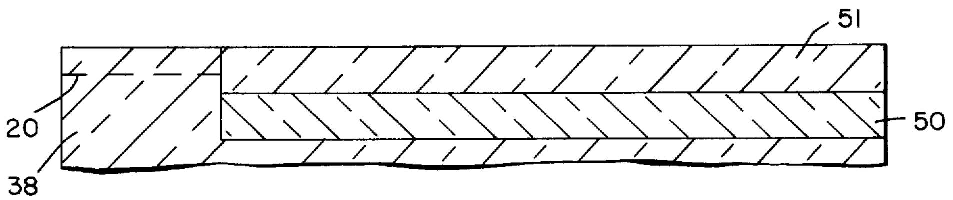

In FIG. 10 there is shown the result of implaning zinc ions into the region where the laser 36 is desired and following this step by annealing at 900°C as described in detail above in connection with fabrication of the discrete laser. The process of forming the junction 20 of the laser 36 in the integrated circuit devices is exactly the same as described above for fabrication of the laser in discrete component form. Also, it will, of course, be understood that the alternation process of forming the laser 36 by multiple implants of Be ions may, if desired, be substituted for the Zn ions. As noted above the junction 20 may in either event be formed preferably at a depth of 1 or 1.5 microns below the wafer's surface.

Figure 11:
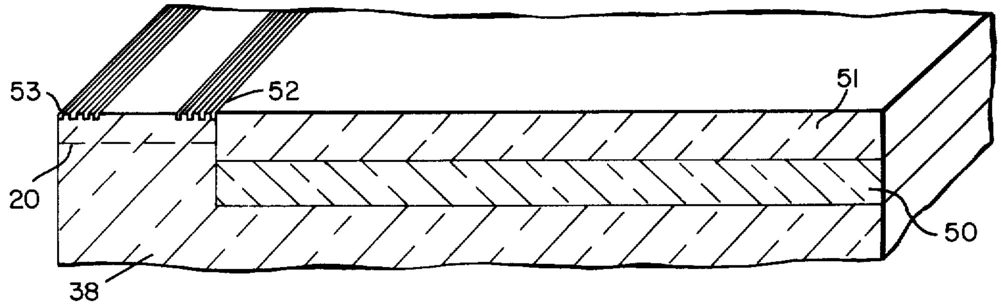
Figure 12:
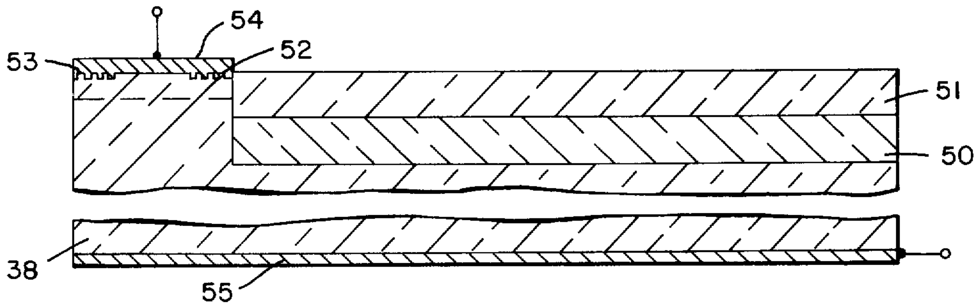

In FIG. 11 there is shown the result of forming reflective gratings on the surface of the wafer using the holographic exposure of photoresist and subsequent ion beam machining technique disclosed in detail in the above referenced copending patent application Ser. No. 336,679 filed on Feb 28, 1973. A first set gratings 52 is formed on the surface of the wafer forming substrate 38 and are thus in a plane parallel to the plane of the junction 20 but extend as rulings parallel to each other in a direction orthogonal to the direction of light emitted from laser 36 into waveguide 40 to be formed in layer 51. A second set 53 of parallel gratings rulings is formed at the opposite interface of the laser section whether this be an interface with air or with additional substrate material. As noted above, a single grating extending the entire length of the laser can alternatively be used. Fundamental Bragg reflection-distributed feedback in a waveguide laser requires a grating spacing (between bars) with a period of $d=\alpha/2n$ where $\lambda$ is the oscillation wavelength and $n$ is the index of refraction of the waveguide material. For gallium arsenide at room temperature $n=3.6$ and $\lambda=0.9$ microns corresponding to $d=0.125$ In FIG. 12 there is illustrated the results of the next step of evaporating contact metalization, such as a gold-germanium alloy, by using standard metallization techniques. A first contact 54 is formed on the upper surface of the wafer above the active laser area in which junction 20 has been formed and overlies the gratings 52 and 53. A second ohmic contact layer 55 is applied to the base of substrate 38.

Figure 13:
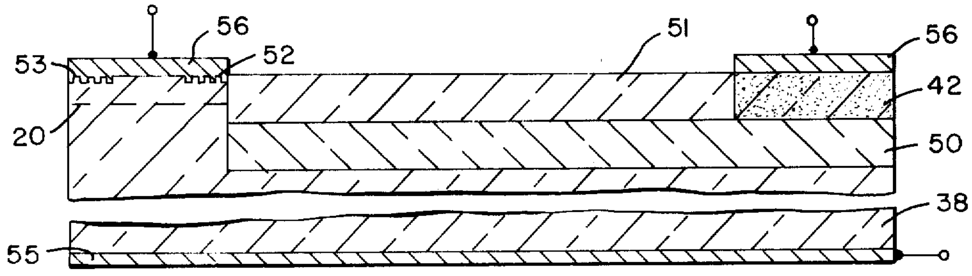

In FIG. 13 there is illustrated the result of forming the integral detector 42 in a volume of the wafer at the end of the waveguide opposite from that of the laser. This detector may be fabricated in accordance with the method disclosed in the above noted copending patent application Ser. No. 390,836 filed on Aug. 23, 1973, and entitled "Integrated Optical Detector". Essentially the method disclosed therein involves proton bombardment of the volume 42 of layers 51 and 52 which are to be changed from waveguiding properties to detecting properties followed by application of a Schottky barrier contact layer 56 above the proton implanted detector region 42.

Figure 14:
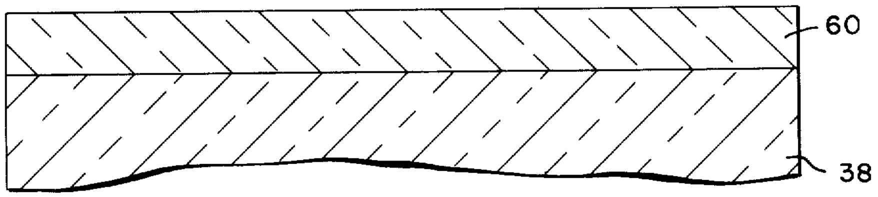
FIGS. 14 and 15 are diagramatic sectional views illustrating steps alternative to those of FIGS. 8 and 9 used in the process of fabricating the device of FIG. 7.
Figure 15:
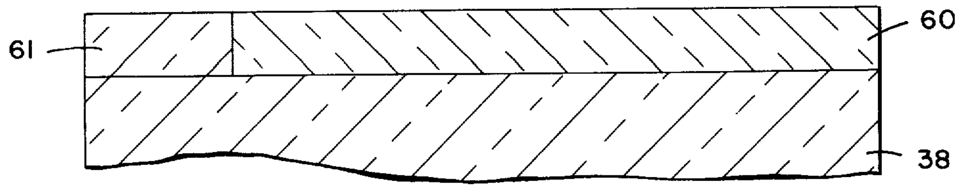

The device shown in FIG. 7 is formed as illustrated in FIGS. 14 and 15 followed by duplication of the steps illustrated in FIG. 10 through 13 as discussed above. In forming the device of FIG. 7 one starts with the substrate 39 (similar to 38) of *n* type gallium-arsenide having *n* approximately $10^{18}/cm^3$. There is then grown an epitaxial layer of gallium-arsenide with *n* approximately $10^{15}/cm^3$ shown in FIG. 14 as a layer 60. This layer exists in the region where a waveguide is desired and is formed by using standard masked epitaxial growth techniques. The layer 60 preferably has a thickness of about 3 microns. Alternatively, the waveguiding region of low carrier concentration could be formed by proton bombardment in accordance with the teaching of the above referenced-copending application Ser. No. 390,836.

FIG. 15 illustrates an optional procedure which may be used in addition to that illustrated in FIG. 14 to improve performance of the device by reducing absorption in the waveguide. In this optional procedure a region of low effective optical band gap is formed at 61 by doping heavily with an n-type dopant such as silicon ($n = 2\text{–}5 \times 10^{18}/cm^3$). The purpose of this step is to shift the emission wavelength of the laser 37 to be formed in the area 61 from approximately 0.9 microns to approximately 1 micron in order to reduce the absorption in the subsequently formed waveguide. The required doping can be achieved by masked diffusion or by ion implantation followed by annealing at 900°C.

Thereafter one proceeds from the device resulting from the step illustrated in either FIG. 14 or FIG. 15 in accordance with design requirements and follows the same procedure used in completing the device of FIG. 6 which has been discussed above in connection with FIGS. 10, 11, 12 and 13.

In the above procedures it should be borne in mind that when gallium aluminum arsenide epitaxial layers are to be formed, liquid epitaxy is the more desirable method for several reasons. First, the liquid matrix enables the growth to be performed in a controlled stable environment. Second, the very reactive nature of aluminum would make it very difficult, if not possible, to grow layers with aluminum using the vapor phase transport method. Third, the high segregation coefficient of aluminum makes it possible to grow gallium aluminum arsenide layers from melts with low concentration of aluminum, which reduces the corrosiveness of the melt on the container. On the other hand, if one requires only gallium-arsenide epitaxial layers, or, if one has to use one or more vapor phase dopants, it is advantageous to use the vapor epitaxial technique.

There are thus, three major techniques of epitaxial growth. That is to say, the two variants of liquid epitaxy — the infinite source and the limited source epitaxy — and the vapor epitaxy. The infinite source epitaxy uses a large melt of gallium saturated with GaAs. A seed wafer of GaAs is dipped into the melt and the solution cooled to permit the epitaxial growth on the wafer. The major advantages of this method are the stability of composition provided by the large melt and the uniformity of temperature and growth conditions over extended periods of time. These result in epilayers of a large area (over 48 $cm^2$) with uniform and reproducible properties.

In contrast to the infinite source approach, the limited source method uses a small amount of melt. One of the best known variants of this technique is the graphite slide bar assembly with pockets of melts of known composition that can be slid over substrates to permit thin layer growth. The method has the advantage of being fast, flexible, and economical. It enables the rapid evaluation of a large number of device structures using only small amounts of materials; it also allows the growth of several layers in succession in one single experiment. These qualities recommend its use in experiments to evaluate alternative structures in a rapid and economic fashion. Based on the results, an infinite sourrce approach can be subsequently perfected to grow large areas necessary for integrated device assemblies. The advantages of the vapor phase epitaxial technique have already been mentioned above. The details of the specialized techniques described in copending applications are as follows.

The above referenced copending patent application Ser. No. 390,836 which teaches a method of proton bombardment and is entitled "Integrated Optical Detector" discloses an integrated optical detector comprising a semiconductor substrate having an optical waveguide formed integrally therewith and a photodetector made from the same semiconductor material as the waveguide and integrally coupled to it. The detector region is sensitive to light of the same wavelength that can be transmitted through the waveguide region of the semiconductor without excessive absorption thereby by virtue of the fact that after the waveguide is formed proton bombardment of the detector portion is used to create optically active defect centers thereby shifting the effective absorption edge in the detector region. Where gallium-arsenide is used as a semiconductor, defect levels induced by implantation of high energy protons give rise to optical absorption between 6 microns and 0.9 microns. This results in detector action in the presence of a Schottky barrier depletion layer. Detector response times less than 200 nanoseconds and external quantum efficiencies of 16% have been observed in such a device.

In this method proton bombardment is used to create in the already formed waveguide the active detector volume with an absorption edge at a longer wavelength than that characteristic of the non-bombarded semiconductor waveguide region. After the waveguide region is formed in the gallium-arsenide semiconductor substrate the selected photodetector region thereon is irradiated with protons to create optically active defect centers in the gallium-arsenide itself at the detector location. In one exemplary device the portion of the waveguide to be converted to a detector was exposed to 300KeV proton radiation, the total integrated flux of which was $2 \times 10^{15}/cm^2$. The damage layer produced was approximately 3 microns thick with the peak at about 2.5. The detector formation should be carried out after all necessary annealing steps in prior fabrication techniques have been performed since annealing of the proton irradiated region will reduce the detector action or intended losses incurred in the detector region.

The above referenced copending patent application Ser. No. 336,679 filed Feb. 28, 1973, discloses a method whereby the required surface reflective gratings for the laser of the present invention may be formed. That application discloses a process for fabricating small geometry electronic devices, including a variety of integrated optical devices. The process includes the steps of holographically exposing a resist masking layer to a plurality of optical interference patterns formed by angularly intersecting laser beams in order that selective resist solvents may be used to develop a masking pattern on the resist coated surface of a semiconductive body. Thereafter, regions of the body exposed by openings in the masking pattern are ion beam etched to thereby establish very small dimension undulations in these regions. These closely spaced undulations consitute the grating reflectors referred to herein. In this process the gallium-arsenide substrate has a photoresist layer deposited thereon using known semiconductor processing techniques. The photoresist layer may be Kodak's metal etched negative resist or Kodak thin film negative resist, each of which is commercially available at the Kodak Company of Rochester, N.Y. Once the photoresist layer is sufficiently dry, this entire layer is exposed to a pair of coherent laser beams which are incident thereon from a common source in order to establish their coherence but which each arrive at the surface at an angle alpha with respect to a perpendicular or normal to the plane of the photoresist layer. The two coherent laser beams may be formed by using known optical procesing techniques wherein a beam splitter is utilized together with other suitable reflectors. The optical interference pattern produced by the interaction of the two laser beams at an angle of $2\alpha$ at the semiconductor surface produces alternate light and dark areas on the surface of the photoresist layer which serve to expose this layer in a plurality of alternate parallel strips. These exposed strips will withstand the subsequent development of the photoresist layer to remove the intermediate unexposed regions of the layer beneath the dark areas of the resist layers assuming a "negative" photoresist is used. A suitable etchant such as xylene may be used to remove the unexposed portions of photoresist layer. The foregoing development process produces a photo-masked structure on the upper surface of the semiconductor substrate which may be used as a mask for ion beam machining of those portions of the resist which have been removed. The alternate photoresist regions which have been removed and which have not been removed have their centers spaced apart a distance $D = \lambda/2$ sine $\alpha$ where $\lambda$ is the wavelength of the laser beam used to expose the photoresist layer and where $\alpha$ is the angle of incidence discussed above.

Each of the above techniques may be used where necessary to a particular device fabrication when using the junction fabrication techniques disclosed above. Many other circuit configurations and combinations utilizing the resulting integral laser and waveguide will be apparent to those skilled in the art.

What is claimed is:

1. In a semiconductor injection laser of the type having a p-n junction formed in a semiconductor body, means providing feedback of light emitted from said laser junction and means to supply pumping energy to said laser, said laser being further characterized by:

said p-n junction being formed by implanting dopant ions into a surface of said semiconductor body, forming a passivating layer on said surface and annealing said implanted body at a temperature and during a time preselected to diffuse said implanted ions to form a uniform planar junction at a predetermined depth below said surface.

2. A laser as in claim 1 wherein said predetermined depth of said junction below said surface is proportional to the square root of said time of annealing for a given fixed temperature.

3. A laser as in claim 1 wherein said predetermined depth below said surface is of the order of magnitude of one micron.

4. A laser as in claim 1 wherein said semiconductor body is n-type GaAs and said dopant ions are $Zn^+$.

5. A laser as in claim 1 wherein said semiconductor body is tellurium doped ($1\times10^{18}/cm^3$) <100> n-type GaAs, said dopant ions are $Zn^+$ with a dose of $10^{16}/cm^2$ implanted at an energy of 300KeV, said passivating layer is $SiO_2$, said annealing is for three hours at 900°C, and the depth of said junction below said surface is substantially one micron.

6. A process of forming a shallow p-n junction at a controlled depth in a semiconductor body of a first conductivity type comprising the steps of:

a. irradiating said semiconductor body with a beam of dopant ions to implant said ions in the irradiated surface of said body to form a layer of a second conductivity type opposite in polarity to said first conductivity type;

b. coating said ion implanted surface of said semiconductor body with a layer of passivating material; and c. annealing said semiconductor body at a temperature sufficient to reduce the concentration of nonradiative centers to the point where efficient lasing and optical emission from said junction can occur; and d. controlling the depth of said junction below the surface of said semiconductor body.

7. A process as in claim 6 wherein said dopant ions diffuse during said annealing and wherein said depth of said junction is controlled by preselecting the time duration of said annealing to have a magnitude the square root of which is linearly proportioned to the desired depth of said junction.

8. A process as in claim 6 wherein said dopant ions do not diffuse significantly during said annealing and wherein said depths of said junction is controlled by sequentially implanting said ions in a plurality of implants each being of a different dose and at a different energy.

9. A process as in claim 6 and further including the step of removing said passivating layer from said annealed semiconductor body and applying ohmic contacts thereto on opposite sides of said junction to form a junction diode.

10. In a process of forming a p-n junction in a semiconductor body of a first conductivity type the improvement comprising:

a. irradiating a surface of said body with a dose of dopant ions of a second conductivity type of opposite polarity to said first type;

b. applying a layer of passivating material to sa' irradiated surface to form an encapsulated source of dopant ions; and c. annealing said irradiated semiconductor body to cause said dopant ions to diffuse primarily into said semiconductor body, for a distance proportional to the square root of the time of annealing.

11. In a semiconductor injection laser of the type having a p-n junction formed in a semiconductor body, means providing feedback of light emitted from said laser junction and means to supply pumping energy to said laser, said laser being further characterized by:

said p-n junction being formed by implanting dopant ions into a surface of said semiconductor body, forming a passivating layer on said surface and annealing said implanted body at a temperature and during a time sufficient to electrically activate the implanted ions, and the depth of said junction below said surface being controlled to form a uniform planar junction at a predetermined depth below said surface.

12. A device as in claim 11 wherein said semiconductor body is GaAs, said dopant ions are zinc and wherein said depth of said junction below said surface is controlled by annealing said implanted body at a temperature and during a time preselected not only to electrically activate the implanted ions but also to diffuse said implanted ions to said controlled junction depth.

13. A device as in claim 11 wherein said semiconductor body is GaAs, said dopant ions are beryllium and wherein said depth of said junction below said surface is controlled by sequentially applying a plurality of implantations of beryllium ions at differing doses and differing energies.

14. A laser as in claim 11 wherein said means providing feedback of light comprises diffraction grating means on said surface of said semiconductor body and said pumping energy supplied to said laser is electrical.

15. A laser as in claim 11 wherein said laser is formed integrally with a waveguide for receiving the light output of said laser, said laser and said waveguide comprising an integrated optical circuit in said semiconductor body.

16. A laser as in claim 11 wherein said laser is formed integrally with a waveguide for receiving the light output of said laser, said laser and said waveguide comprising an integrated optical circuit in said semiconductor body, said means providing feedback of light comprises diffraction grating means on the surface of said semiconductor body, and said pumping energy supplied to said laser is electrical energy supplied through ohmic contacts on opposite surfaces of said semiconductor body.

* * * * *